United States Patent [19]

Bakken

[11] 3,764,930

[45] Oct. 9, 1973

[54] HIGH FIDELITY AUDIO AMPLIFIER

[76] Inventor: Ronald J. Bakken, 3918 31st Ave. South, Minneapolis, Minn.

[22] Filed: June 23, 1971

[21] Appl. No.: 64,200

[52] U.S. Cl. .................... 330/16, 330/30 R, 330/14

[51] Int. Cl. .................... H03f 3/04

[58] Field of Search .................... 330/165, 30 R, 14, 330/15, 16, 17, 166

[56] References Cited

UNITED STATES PATENTS 2,910,688 10/1959 Kelley et al. .................... 330/15 X

*Primary Examiner*—Nathan Kaufman
*Attorney*—Ralph L. Dugger et al.

[57] ABSTRACT

Included in the amplifier is a driver stage having a pair of opposite conductivity transistors connected in complementary symmetry. A transformer couples the driver stage to the power stage. The coupling transformer has first and second primary windings, the first primary winding being connected in the collector-emitter circuit of one of the transistors and the second primary winding being connected in the collector-emitter circuit of the other transistor. In the power stage, there are four identical conductivity transistors. The coupling transformer has four secondary windings with each winding being connected to the base of one of the identical conductivity transistors. The load in the form of a speaker is connected in the collector-emitter circuits of the various identical conductivity transistors.

10 Claims, 1 Drawing Figure

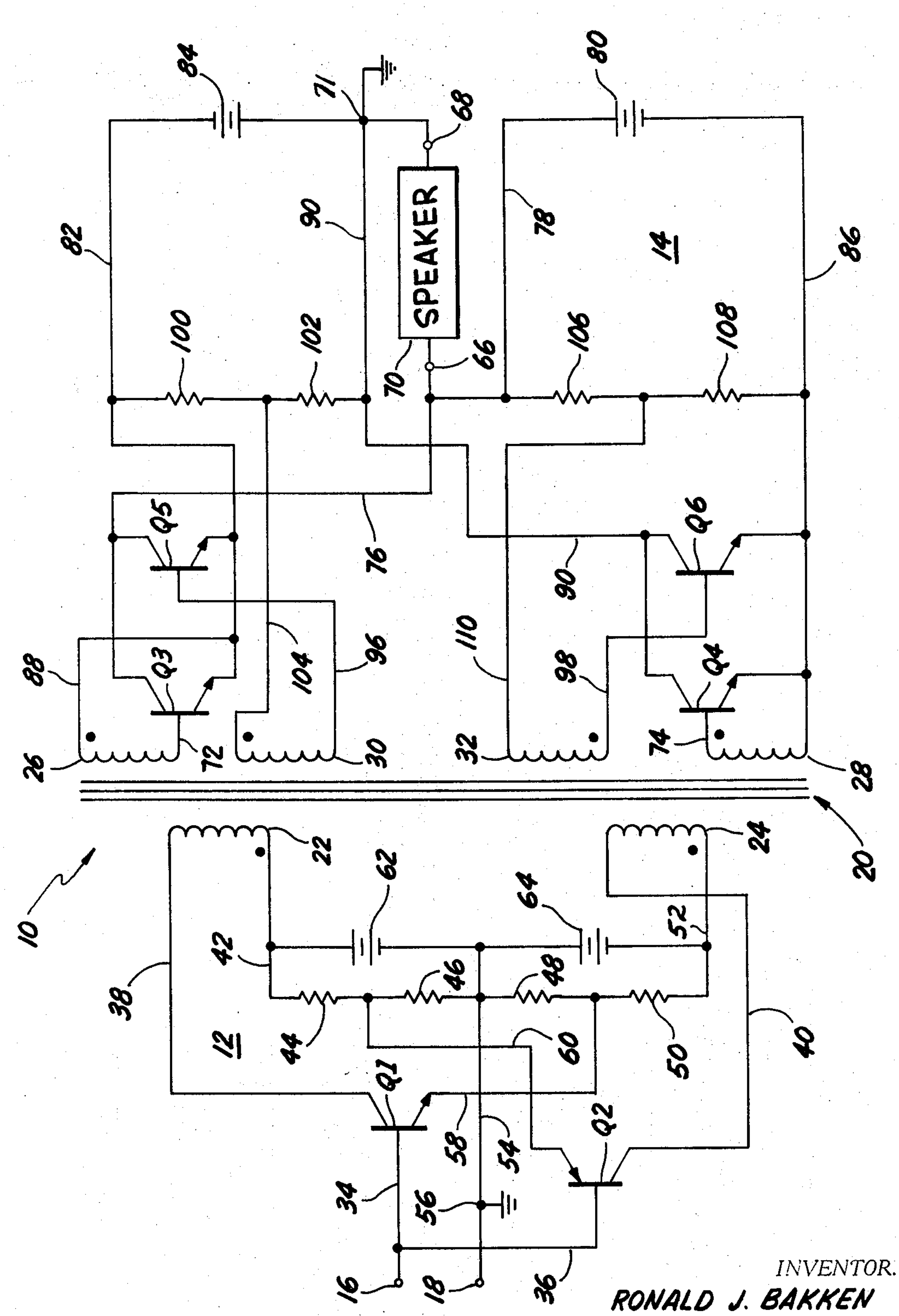
INVENTOR.
RONALD J. BAKKEN
BY
Dugger, Peterson, Johnson & Westman
Attorneys

HIGH FIDELITY AUDIO AMPLIFIER

BACKGROUND OF THE INVENTION

1. Field of the Invention

This invention relates generally to amplifiers, and pertains more particularly to an audio amplifier having its driver stage coupled to its power stage in a manner such that several advantageous functions are simultaneously achieved.

2. Description of the Prior Art

Transistor amplifiers, of course, are not new. Those with which I am familiar have utilized various modes of coupling, either between the driver and power stages or between the output of the power stage and the load. While some of the coupling methods have performed satisfactorily, there are known shortcomings as far as the various types of couplings heretofore resorted to. Generally speaking, those possessing the better operational characteristics have proved to be quite costly, yet those having a lower cost have demonstrated various inadequacies.

SUMMARY OF THE INVENTION

Accordingly, a general object of the present invention is to provide an audio amplifier that is simple and inexpensive, and yet which will possess a number of important attributes.

A more specific object of the invention is to provide an audio amplifier having high efficiency in both the driver and power stages.

Another object of the invention is to provide an amplifier that is virtually hum-free.

In view of the relatively small number of components needed in the construction of my audio amplifier, another object is to provide an amplifier having a good frequency response in spite of its circuit simplicity. This feature is realized without capacitors and by means of a transformer coupling existing only between the driver and power stages, there being no output transformer. The coupling transformer is instrumental in accomplishing several goals in the achieving of the simplicity: (1) it couples the driver transistors by means of untapped primary windings, (2) it couples the power transistors by means of individual secondary windings, and (3) it functions as both a step up and step down transformer even though it is a single unit.

A further object is to provide an amplifier requiring no regulation for the power supplies of either stage.

Yet another object of the invention is to provide an amplifier of the foregoing character that will have a relatively long and trouble-free life.

Briefly, my invention comprises a driver stage composed of a pair of complementary transistors, the collector current of one flowing through one primary winding of a coupling transformer and the collector current of the other flowing through a second primary winding. A simplified biasing arrangement is utilized. With respect to the secondary windings of the transformer, each winding serves to control one of a group of identical conductivity transistors so that the collector current flows through the speaker as amplified by each transistor. As a result of employing four secondary windings, two of which have a smaller number of turns than the primary windings and two of which have a higher number of turns, both a step down and a step up action is derived. Relatively weak signals are faithfully reproduced so that the overall fidelity of the amplifier is enhanced.

BRIEF DESCRIPTION OF THE DRAWING

The sole FIGURE constituting the drawing is a schematic representation of one form of amplifier exemplifying my invention.

DESCRIPTION OF THE PREFERRED EMBODIMENT

The audio amplifier depicted in the drawing has been denoted generally by the reference numeral 10, the amplifier including a driver stage labeled 12 and a power stage indicated by the numeral 14. A pair of input terminals 16 and 18 serve to introduce the input signal to the driver stage. In this regard, the input signal is forwarded from a preamplifier which usually operates at power levels measured in microwatts, or even micromicrowatts.

The driver stage 12 is coupled to the power stage 14 through the agency of a transformer 20 having first and second primary windings 22, 24 and four secondary windings 26, 28, 30 and 32. Although various parameters will be tabulated hereinafter, it can be pointed out at this time that the primary windings 22, 24 have a certain number of turns and the secondary windings 26, 28 have a lesser number of turns so as to provide a step down action and the secondary windings 30, 32 have a larger number of turns so as to perform a step up action. The polarity or phase relationship of the windings 22–32 has been indicated by dots applied to each winding.

Included in the driver stage 12 is a pair of transistors Q1 and Q2, the transistor Q1 being of NPN conductivity and the transistor Q2 being of PNP conductivity. It will be recognized that these transistors Q1, Q2 are connected for operation in a complementary fashion. More specifically, the base of the transistor Q1 is connected to the input terminal 16 via a conductor 34 and the base of the transistor Q2 is connected to this same input terminal by a conductor 36. The collector of the transistor Q1 is connected to one end of the primary winding 22 by means of a conductor 38, whereas the collector of the opposite conductivity transistor Q2 is connected to one end of the other primary winding 24 by a conductor 40. The other end of the primary winding 22 has a conductor 42 extending therefrom to one end of a first resistance element 44. Additional resistance elements 46, 48 and 50 are connected in series with the element 44. The end opposite this resistive array is connected by a conductor 52 to the other end of the primary winding 24. At this time, attention is called to the inclusion of still another conductor labeled 54 which is connected directly to the other input terminal 18, being grounded at 56. When the terminals 16, 18 are connected to a grounded pre-amplifier (not shown). The ground 56 provides a reference potential for the input terminal 18. The conductor 54 extends from the terminal 18 to the junction or connection located between the resistors 46 and 48. A conductor 58 extends from the junction or connection between the resistors 48 and 50 to the emitter of the transistor Q1, whereas in a similar manner a conductor 60 extends from the junction or connection between the resistors 44 and 46 to the emitter of the transistor Q2.

Power supply means is connected between the conductors 42 and 52, being comprised of two batteries 62 and 64. In this regard, it will be observed that the positive side of the battery 62 is connected directly to the conductor 42 whereas its negative side is connected to the conductor 54 and hence to the terminal 18. The battery 64 has its positive side connected directly to the conductor 54 and its negative side connected directly to the conductor 52. Thus, it will be perceived that the resistors 44, 46, 48 and 50 perform a voltage dividing function in the biasing of the transistors Q1 and Q2 by the power supplied by the batteries 62 and 64. In partial summary, it will be seen that the collector-emitter circuit of the transistor Q1 is connected so as to include the primary winding 22, whereas the collector-emitter circuit of the transistor Q2 is connected so as to include the primary winding 24. It will be further appreciated that the primary windings 22 and 24 do not have any center tap associated with them.

Passing now to a description of the power stage 14, it will first be observed that a first pair of identical conductivity transistors Q3 and Q4 are employed. Additional transistors Q5 and Q6 are also contained in the power stage 14. Further included in the power stage 14 are output terminals 66 and 68, a load in the form of a speaker 70 being connected there between. Either output terminal 66 or 68 may be grounded and provides a reference potential with respect to the ungrounded terminal; in the illustrated instance, the output terminal 68 is grounded, the ground being denoted by the reference numeral 71.

Having mentioned the transistor Q3, it will be noted that a conductor 72 connects one end of the secondary winding 26 directly to the base of this particular transistor. In a similar fashion, a conductor 74 connects one end of the secondary winding 28 to the base of the transistor Q4. The collectors of the transistor Q3, Q5 are connected by means of conductors 76, 78 to the positive side of a battery 80 functioning as part of the power supply for the power stage 14. The emitters of the transistors Q3, Q5 are connected by a conductor 82 to the negative side of a battery 84 which is also part of the overall power supply for the power stage 14. The negative side of the battery 80 is connected via a conductor 86 to one end of the secondary winding 28 and to the emitters of the transistors Q4, Q6.

The conductor 76 between the collectors of the transistors Q3, Q5, making connection with the output terminal 66. The other end of the secondary winding 26 is connected by a conductor 88 to the emitters of the transistors Q3, Q5. A conductor 90 extends from the collectors of the transistors Q4, Q6 to the positive side of the battery 84 and to the output terminal 68. It can be mentioned at this point that the respective collector-emitter currents flowing through the transistors Q3, Q4, Q5 and Q6 flow through the speaker 70.

It will be seen that the base of the transistor Q5 is electrically connected to one end of the secondary winding 30 by a conductor 96, whereas the base of the transistor Q6 is connected to one end of the secondary winding 32 by a conductor 98. A pair of resistance elements 100 and 102 are serially connected between the conductors 82 and 90, the junction or connection there between being electrically connected by a conductor 104 to the other end of the secondary winding 30. In a like manner, a second pair of resistance elements 106 and 108 are serially connected between the conductors 78 and 86, there being a conductor 110 extending from the junction or connection there between to the other end of the secondary winding 32.

Owing to the fact that the number of turns in the windings 30 and 32 is greater than the number of turns in the windings 22 and 24, there is a step up transformation from the primary side of the transformer 20 to the secondary side thereof as far as the windings 30, 32 are concerned. This is in contrast to the step down relationship existing with respect to the windings 26 and 28 with respect to the windings 22 and 24.

OPERATION

Although it is believed that the operation of my amplifier 10 can be understood from the description already given, nonetheless a brief sequence of what occurs should be of further help in appreciating the benefits to be derived. Accordingly, the input signal is delivered to the terminals 16 and 18. Initially, the input terminals 16, 18 are at ground when under a quiescent or no signal condition. Although reference should be made to the table of component values appended hereto, it can be mentioned at this time that the biasing resistors 44, 46, 48 and 50 take from 6.3 to 6.6 milliamps from the 19 volt batteries 62 and 64 constituting the power supply. The transistors Q1 and Q2 add approximately 0.6 and 0.7 milliamps to the drain mentioned immediately above. Consequently, due to the fact that the biasing resistors 44 and 50 are of equal value, and due to the fact that resistors 46 and 48 are of equal value, although providing opposite polarities for the two transistors Q1 and Q2, and the power supplies 62, 64 are each equal, being 19 volts each, there occurs a circulating forward biasing current. Each of the complementary pair of transistors Q1 and Q2 is forward biased at 0.62 volt, which voltage is necessray to prevent cross over distortion.

It can be explained that with the input terminals 16, 18 at DC ground potential, that is when there is quiescence, the resistor noise is cancelled. Also, there is very little output hum and noise present with the input terminals 16, 18 either open or shorted. The input impedance is about 10K ohms. Thus, the low hum is a result of the cross cancellation of the power supply voltage fluctuations, because the effect from each is equal and opposite. Stated somewhat differently, if the line voltage goes up, the plus side rises and the minus side likewise increases. Hence, the increased current flowing through the primary windings 22 and 24 of the transformer 20 are mutually negating.

Having prefaced the operational description with the foregoing comments, it should be obvious that when the positive portion of the signal is impressed on the base of the transistor Q1, the transistor Q1, being of NPN conductivity, is caused to conduct as the bias applied to the base of this transistor increases in a positive direction. This results in a positive going signal being forwarded to the primary winding 22. The flow of current can be traced through the conductor 38, the primary winding 22, the resistors 44, 46 and 48, and the conductor 58.

Due to the fact that the transistor Q2 is of opposite conductivity, the positive potential applied to the base thereof over the conductor 36 does not cause this transistor to become conductive at this time. Therefore, no current flow to the primary winding 24 results at this time. It is only during the negative portion of the incoming signal that the transistor Q2 becomes conductive.

The collector-emitter flow of current, when the transistor Q2 conducts, can be traced in a similar manner as was done with respect to the collector-emitter circuit of transistor Q1. In this regard, it will be seen that the flow is via the conductor 40, the primary winding 24, the resistors 50, 48, 46 and the conductor 60.

It can be stated that the driver stage 12 operates in a Class AB manner. Power stage 14, however, operates in a Class B fashion. Both transistors Q1, Q2 share the burden of amplification, each amplifying proportionally its half of the incoming signal. In the phasing of the transformer 20, there is an automatic cancellation of the voltage fluctuations caused by the power supplies 62, 64. Regarding the power supplies 62, 64, it will be recognized that batteries 62 and 64 have been depicted but that in actual practice the power would be derived from an alternating current source, and that rectifiers, together with electrolytic capacitors, would provide the direct current voltages (with ripples) that in the drawing are supplied by the batteries 62, 64.

As already indicated, an object of the present invention is to eliminate the need for an output transformer. This is quite a saving in cost, size and weight. Thus, by using two equal power supplies 62, 64 (actually a single center-tapped supply) in conjunction with the transformer 20, the same conductivity or polarity transistors can be used in the power stage 14. Thus, it will be appreciated that the transistors Q3, Q4, Q5 and Q6 are of identical conductivity, in the illustrative situation being NPN transistors.

With respect to the transistor Q3, it will be noted that a positive portion signal appears at the end connected via the conductor 72 to the base of the transistor Q3 (due to the polarity or phase relationship between the windings 22 and 24), and as this becomes more positive, the base of the transistor Q3 causes the transistor Q3 to become conductive. In the collector-emitter circuit of the transistor Q3 are the output terminals 66, 68, and the serially connected speaker 70, thereby having this current flow therethrough. Due to the proximal relationship of the secondary winding 30 with the winding 26, the same inductive action occurs with respect to the winding 30 as does with respect to the winding 26 with the exception that the winding 30 has a greater number of turns than the winding 26 and also a greater number of turns than the primary winding 22. This action causes the transistor Q5 to become conductive. Actually, the transistor Q5 is really a helper type of transistor, being utilized so as to develop to a fuller extent the faint and lowest level signals. Such minute values are encountered with respect to certain passages of music.

At any rate, the combined current effect contributed by the transistors Q3 and Q5 is reflected in the output signal to the speaker 70, more specifically the positive portion thereof at this time. The voltage furnished by each battery 84 and 80, which illustratively constitute the power supply for the stage 14, is 47.5 volts.

When the incoming signal at the terminals 16, 18 goes negative, then there is a positive going signal applied to the base of the transistor Q4 to render this transistor conductive, and with the help of the transistor Q6, the two provide the negative portion of the output signal through the speaker 70.

It should be apparent from the foregoing description that there is an extremely low amount of hum and noise, generally less than one microwatt. The amplifier 10 also responds to changes in volume much faster than many other amplifiers. The harmonic distortion, being proportional to volume, is greatest at full volume; however, the amplifier 10 meets and exceeds all requirements for high fidelity at low and medium listening levels. Not only are the foregoing attributes achieved, but the amplifier results in a compact, lightweight, and a rugged amplifier, both physically and electrically. Mismatches, as with many prior art amplifiers, become relatively unimportant when selecting components for an amplifier to be constructed in accordance with the teachings of the instant invention.

Although the parameters for the components can be varied, it will be of some help to have a listing of the components found practical. Accordingly, the following table of components is set forth:

| | |
|---|---|
| Q1 | 2N3053 |
| Q2 | 2N4037 |
| Q3–Q6 | 2N3233 |
| Transformer **20** | M6 Grade, 3-¼% silicon steel, grain oriented, 0.016" laminations, **210** turns in each of the primary windings **22** and **24, 30** to **60** turns in each of the secondary windings **26** and **28**, and **300** turns in each of the secondary windings **30** and **32**. |
| Resistors **102,106** | 22K ohms |
| Resistors **44,50** | 2.7K ohms |
| Resistors **46,48** | 100 ohms |
| Resistors **100,108** | 470 ohms |

I claim:

1. A high fidelity audio amplifier comprising a pair of input terminals and a pair of output terminals, a first pair of opposite conductivity type transistors, each having a base, collector and emitter, the bases of said transistors being connected together and to one of said input terminals, a transformer having first and second primary windings and first and second secondary windings, first means connecting the first primary winding in circuit with the collector and emitter of one of the first pair of transistors, second means connecting the second primary winding in circuit with the collector and emitter of the other transistor of said first pair of transistors, first biasing means to apply operating potentials to the collectors and emitters of said first pair of transistors to bias said first pair of transistors to be normally substantially non-conducting, means connecting the other of said pair of input terminals to said first biasing means to provide a reference potential for said other input terminal with respect to said one input terminal so that said first pair of transistors become alternately sufficiently conductive to supply signals to said first and second primary windings as a result of an alternating current signal being applied to said input terminals, a second pair of identical conductivity transistors, each having a base, collector and emitter, means connecting one end of the first secondary winding to the base of one of said second pair of transistors, means connecting said output terminals in circuit with the collector and emitter of said one transistor of the second pair of transistors, means connecting the other end of the first secondary winding to the emitter of said one transistor of the second pair of transistors, means connecting one end of the second secondary winding to the base of the other of said second pair of transistors, means connecting said pair of output terminals in circuit with the collector and emitter of said other transistor of the second pair of transistors, means connecting the other end of the second secondary winding to the emitter of said other transistor of the second pair of transistors, and second biasing means to apply operating potentials to the collectors and emitters of said second pair of transistors to bias said second pair of transistors to be normally substantially non-conducting, means connecting one of said output terminals to said second biasing means to provide a reference potential for said one output terminal with respect to the other output terminal so that said second pair of transistors become alternately sufficiently conductive to supply output signals to said output terminals as a result of signals applied from said first and second secondary windings to the bases of said second pair of transistors.

2. The audio amplifier of claim 1 in which said first biasing means for said first pair of transistors includes a plurality of resistance elements connected in series between one end of said first primary winding and one end of said second primary winding and power supply means connected between said one ends in parallel with said plurality of resistance elements, said first means which connects the first primary winding in circuit with the collector and emitter of said one transistor of the first pair of transistors including a first conductor extending from the collector of said one transistor to the other end of the first primary winding and a second conductor extending from a first junction located between two of said resistance elements to the emitter of said one transistor, said second means which connects the second primary winding in circuit with the collector and emitter of the other transistor of said first pair including a first conductor extending from the collector of said other transistor to the other end of the second primary winding and a second conductor extending from a second junction located between another two of said resistance elements to the emitter of said other transistor, said means connecting the other of said pair of input terminals to said first biasing means including a conductor extending from said power supply means to said other input terminal.

3. The audio amplifier of claim 2 in which said plurality of resistance elements includes first, second, third and fourth serially connected elements, said first junction being between said third and fourth elements and said second junction being between said first and second elements.

4. The audio amplifier of claim 3 in which the conductor extending from said power means to the other of said input terminals is connected to a third junction located between said second and third resistance elements.

5. The audio amplifier of claim 4 in which said power supply means includes first and second direct current supplies, said first supply being connected between said one end of the first primary winding and said conductor which extends to said other input terminal and which conductor is connected to said third junction.

6. The audio amplifier of claim 5 in which said one transistor of the first pair is of NPN conductivity and the other transistor of said first pair is of PNP conductivity, the positive side of said first supply being connected to said one end of the first primary winding and the negative side of said second power supply being connected to said one end of the second secondary winding.

7. The audio amplifier of claim 1 in which said means for connecting said one end of the first secondary winding to the base of said one of said second pair of transistors includes a conductor extending from the said one end of said first secondary winding to the base of said one of said second pair of transistors and said means connecting the other end of said first secondary winding to the emitter of said one of said second pair of windings includes a conductor extending from the said other end of said first secondary winding to the emitter of said one transistor of said second pair of transistors and in which said means for connecting said one end of the second secondary winding to the base of said other of said second pair of transistors includes a conductor extending from said one end of said second secondary winding to the base of the other of said second pair of transistors and said means connecting the other end of said second secondary winding to the emitter of said other of said second pair of windings includes a conductor extending from the other end of said second secondary winding to the emitter of said other transistor of said second pair of transistors.

8. The audio amplifier of claim 7 in which said second biasing means includes power supply means having first and second direct current supplies one side of said last-mentioned first direct current supply being connected to said one output terminal and to the collector of said one transistor of said second pair and one side of the second direct current supply being connected to the other of said output terminals and to the collector of said other transistor of said second pair of transistors, the other side of said first direct current supply being connected to the emitter of said other transistor of said second pair and the other side of said second direct current supply being connected to the emitter of said one transistor of said second pair of transistors.

9. The audio amplifier of claim 8 in which said transformer has a third secondary winding proximally related to said first secondary winding and a fourth secondary winding proximally related to said second secondary winding, a third pair of transistors of the same conductivity type as said second pair of transistors, each having a base, collector and emitter, said second biasing means for said second pair of transistors also supplying the operating potentials to the collectors and emitters of said third pair of transistors to bias said third pair of transistors to be normally substantially non-conducting and including a first pair of resistance elements connected in series with each other and in parallel with said first direct current supply, a second pair of resistance elements connected in series with each other and in parallel with said second direct current supply, a conductor extending from the junction located between the resistance elements of said first pair of resistance elements to one end of said third secondary winding to the base of one of said third pair of transistors, a conductor extending from the junction located between the resistance elements of said second pair of resistance elements to one end of said fourth secondary winding and a conductor extending from the other end of said fourth secondary winding to the base of the other of said third pair of transistors, the collector and emitter of said one transistor of said third pair of transistors being in parallel with the collector and emitter of said one transistor of said second pair of transistors, and the collector and emitter of said other transistor of the third pair of transistors being in parallel with the collector and emitter of said other transistor of said second pair of transistors.

10. The audio amplifier of claim 9 in which said first and second primary windings have a certain number of turns, said first and second secondary windings a lesser number and said third and fourth secondary windings a greater number.

* * * * *